US012780671B2

(12) United States Patent
Sumitani et al.

(10) Patent No.: US 12,780,671 B2
(45) Date of Patent: Nov. 3, 2026

(54) SILICA PARTICLE, SILICA SOL, POLISHING COMPOSITION, POLISHING METHOD, METHOD FOR PRODUCING SEMICONDUCTOR WAFER, AND METHOD FOR PRODUCING SEMICONDUCTOR DEVICE

(71) Applicant: Mitsubishi Chemical Corporation, Tokyo (JP)

(72) Inventors: Naoko Sumitani, Tokyo (JP); Tsutomu Yonemori, Tokyo (JP); Eiji Dejima, Tokyo (JP); Yasuhiro Kawase, Tokyo (JP)

(73) Assignee: Mitsubishi Chemical Corporation, Tokyo (JP)

( * ) Notice: Subject to any disclaimer, the term of this patent is extended or adjusted under 35 U.S.C. 154(b) by 725 days.

(21) Appl. No.: 17/815,006

(22) Filed: Jul. 26, 2022

(65) Prior Publication Data

US 2022/0363554 A1 Nov. 17, 2022

Related U.S. Application Data

(63) Continuation of application No. PCT/JP2021/002435, filed on Jan. 25, 2021.

(30) Foreign Application Priority Data

Jan. 28, 2020 (JP) ................................ 2020-011471

(51) Int. Cl.

| | |
|---|---|
| ***C01B 33/18*** | (2006.01) |
| ***C09G 1/02*** | (2006.01) |
| ***C09K 3/14*** | (2006.01) |
| ***H10P 52/40*** | (2026.01) |

(52) U.S. Cl.

CPC ................ *C01B 33/18* (2013.01); *C09G 1/02* (2013.01); *C09K 3/1409* (2013.01); *H10P 52/402* (2026.01); *C01P 2004/03* (2013.01); *C01P 2004/54* (2013.01); *C01P 2004/64* (2013.01); *C01P 2006/80* (2013.01)

(58) Field of Classification Search

CPC ..... C01B 33/18; C01B 33/145; C01B 33/141; C09G 1/02; C09K 3/1409; C09K 3/1463; C09K 3/1454; C09K 3/14; H01L 21/30625; H01L 21/02024; H01L 21/304; C01P 2004/03; C01P 2004/64; C01P 2004/54; C01P 2006/80

See application file for complete search history.

(56) References Cited

U.S. PATENT DOCUMENTS

| | | | | |
|---|---|---|---|---|
| 4,842,837 A | 6/1989 | Shimizu et al. | | |
| 2011/0318581 A1 | 12/2011 | Zenitani et al. | | |
| 2014/0319411 A1 | 10/2014 | Sakaida et al. | | |
| 2018/0155591 A1 | 6/2018 | Kumazawa et al. | | |
| 2021/0002513 A1 * | 1/2021 | Egami | ...................... | C09G 1/02 |

FOREIGN PATENT DOCUMENTS

| | | | | | |
|---|---|---|---|---|---|
| CN | 105731468 A | | 7/2016 | | |
| CN | 110713192 A | | 1/2020 | | |
| JP | 61-209910 A | | 9/1986 | | |
| JP | 63-74911 A | | 4/1988 | | |
| JP | 4-187512 A | | 7/1992 | | |
| JP | 6-316407 A | | 11/1994 | | |
| JP | 11-60232 A | | 3/1999 | | |
| JP | 2007-153732 A | | 6/2007 | | |
| JP | 2008-37700 A | | 2/2008 | | |
| JP | 2008273780 A | * | 11/2008 | ............ | C01B 33/14 |
| JP | 2010-58985 A | | 3/2010 | | |
| JP | 2012-6796 A | | 1/2012 | | |
| JP | 5084670 B2 | * | 11/2012 | ............ | B24B 37/00 |
| JP | 2013-40081 A | | 2/2013 | | |
| JP | 5348400 B2 | * | 11/2013 | ............ | C01B 33/14 |
| JP | 2014-198649 A | | 10/2014 | | |
| JP | 2019-19222 A | | 2/2019 | | |
| JP | 2019-77669 A | | 5/2019 | | |
| JP | 2019-89692 A | | 6/2019 | | |
| JP | 2019-172558 A | | 10/2019 | | |
| WO | WO 2013/073025 A1 | | 5/2013 | | |
| WO | WO-2019189610 A1 | * | 10/2019 | ............ | B24B 37/00 |

OTHER PUBLICATIONS

JP_5084670_B2_Machine_Translation (Year: 2012).*
JP_2008273780_A_Machine_Translation (Year: 2008).*
JP_5348400_B2_Machine_Translation (Year: 2013).*
Hartlen et al. Facile preparation of highly monodispersed small silica spheres (15 to >200 nm) suitable for colloidal templating and formation of ordered arrays. Langmuir, 24, pp. 1714-1720 (Year: 2008).*
Statement of Submission of Publications by Japan Patent Office retrieved from IDS received on Nov. 5, 2025 (Year: 2025).*
Japanese Office Action issued Sep. 3, 2024 in Japanese Patent Application No. 2021-574020, 17 pages (with English machine translation).
Chinese Office Action issued Jan. 19, 2024 in Chinese Application No. 202180011041.9 with English translation, therein, 23 pgs.
International Search Report issued Apr. 6, 2021 in PCT/JP2021/002435, filed on Jan. 25, 2021, 3 pages.

(Continued)

*Primary Examiner* — Amber R Orlando
*Assistant Examiner* — Anastasia A. Kuvayskaya
(74) *Attorney, Agent, or Firm* — Oblon, McClelland, Maier & Neustadt, L.L.P.

(57) ABSTRACT

An object of the present invention is to provide a silica particle, a silica sol containing the silica particle, and a polishing composition containing the silica sol, which prevent secondary aggregation, have excellent dispersion stability, and are suitable for polishing. The present invention relates to a silica particle in which an average value of a circularity coefficient measured by a field-emission scanning electron microscope is 0.90 or more, and a standard deviation of the circularity coefficient is 0.05 or less.

16 Claims, No Drawings

(56) References Cited

OTHER PUBLICATIONS

Shinichi Sugita, “Technology and characteristics of high-purity colloidal silica”, JETI, vol. 61, No. 3, 2013, 10 Pages (with English translation).
Stöber et al., “Controlled Growth of Monodisperse Silica Spheres in the Micron Size Range”, Journal of Colloid and Interface Science vol. 26, 1968, 8 Pages.
Extended European Search Report issued Jun. 30, 2023 in European Patent Application No. 21747821.3, 7 pages.
Combined Chinese Office Action and Search Report issued Jun. 30, 2023 in Patent Application No. 202180011041.9 (with English language translation and English translation of Category of Cited Documents), 24 pages.
Japanese Office Action issued Apr. 8, 2025 in Japanese Patent Application No. 2021-574020 (with unedited computer-generated English translation), 7 pages.
JP—Information offer 2024-230287 dated Jul. 15, 2025, with English Translation.
Kurtis D. Hartien et al.; “Facile Preparation of Highly Monodisperse Small Silica Spheres (15 to >200 nm) Suitable for Colloidal Templating and Formation of Ordered Arrays”; Langmuir 2008, vol. 24, pp. 17147-1720.
Office Action mailed on Nov. 17, 2025 in a corresponding Korean Application No. 10-2022-7026002, 11 pages, with English machine translation.
Office Action issued on Dec. 9, 2025, in the corresponding Japanese Patent Application No. 2024-230287, (with computer-generated English translation), 18 pages.

* cited by examiner

SILICA PARTICLE, SILICA SOL, POLISHING COMPOSITION, POLISHING METHOD, METHOD FOR PRODUCING SEMICONDUCTOR WAFER, AND METHOD FOR PRODUCING SEMICONDUCTOR DEVICE

TECHNICAL FIELD

The present invention relates to a silica particle, a silica sol, a polishing composition, a polishing method, a method for producing a semiconductor wafer, and a method for producing a semiconductor device.

BACKGROUND ART

A polishing method using a polishing liquid has been known as a method for polishing a surface of a material such as a metal or an inorganic compound. Among them, in final finish polishing of a prime silicon wafer for a semiconductor or a recycled silicon wafer thereof, and chemical mechanical polishing (CMP) such as planarization of interlayer dielectrics, formation of a metal plug, and formation of an embedded wiring at the time of producing a semiconductor device, a surface state thereof greatly affects semiconductor characteristics. Therefore, surfaces and end surfaces of these components are required to be polished with extremely high accuracy.

In such precision polishing, a polishing composition containing silica particles is adopted, and colloidal silica is widely used as abrasive particles which are main components of the polishing composition. Colloidal silica is known to be produced by thermal decomposition of silicon tetrachloride (fumed silica or the like), by deionization of alkali silicate such as water glass, by a hydrolysis reaction and a condensation reaction of alkoxysilane (generally referred to as "a sol-gel method"), or the like due to differences in production method.

With regard to a method for producing a silica particle, many studies have been made so far. For example, Patent Literatures 1 to 4 and Non-Patent Literatures 1 and 2 disclose a method for producing silica particles by a hydrolysis reaction and a condensation reaction of alkoxysilane.

In general, silica particles in a silica sol produced by a hydrolysis reaction and a condensation reaction of alkoxysilane show various shapes such as a spherical shape, a cocoon shape, and an irregular shape immediately after synthesis, as disclosed in Non-Patent Literature 1.

Patent Literature 1 discloses silica particles having a cocoon shape. Patent Literature 2 discloses silica particles having an irregular shape (elongated shape).

However, when silica particles having a cocoon shape or an irregular shape such as silica particles disclosed in Patent Literature 1 or Patent Literature 2 are used as a polishing composition, the polishing composition has an excellent polishing force, but also causes flaw to an object to be polished. Therefore, there is a problem that an object to be polished having a smooth surface cannot be obtained. In addition, when the silica particles having a cocoon shape or an irregular shape are used as the polishing composition, the silica particles are easily changed in physical properties such as secondary aggregation of the silica particles during storage or use, and there is a problem that the stability of the polishing performance is poor.

In order to solve these problems, silica particles having a more perfect spherical shape are required.

Even when silica particles having a large particle diameter are used as a polishing composition, the polishing composition has an excellent polishing force, but also causes flaw to an object to be polished. Therefore, there is a problem that an object to be polished having a smooth surface cannot be obtained. In addition, the silica particles are easily changed in physical properties, such as secondary aggregation of the silica particles and precipitation of the silica particles during storage or use of the silica particles, and there is a problem that the stability of the polishing performance is poor.

In order to solve these problems, silica particles having a smaller particle diameter are required.

Patent Literatures 3 to 4 and Non-Patent Literature 2 disclose particles close to a perfect sphere and silica particles having a small particle diameter, but silica particles close to a perfect sphere and having a small particle diameter are not disclosed, and it cannot be said that it is sufficient to solve the problem that an object to be polished having a smooth surface cannot be obtained and the problem that the stability of the polishing performance is poor.

CITATION LIST

Patent Literature

Patent Literature 1: JP-A-H11-60232
Patent Literature 2: JP-A-H4-187512
Patent Literature 3: WO2013/073025
Patent Literature 4: JP-A-S61-209910

Non-Patent Literature

[Non-Patent Literature 1] "Technology and characteristics of high-purity colloidal silica" Shinichi Sugita, JETI, Vol. 61, No. 3, pp 58-61, (2013).

[Non-Patent Literature 2] "Controlled growth of monodisperse silica spheres in the micron size range" Stayer, Journal of Colloid and Interface Science Vol. 26, 62-69, (1968).

SUMMARY OF INVENTION

Technical Problem

The present invention has been made in view of such circumstances, and an object of the present invention is to provide a silica particle, a silica sol containing the silica particle, and a polishing composition containing the silica sol, which prevent secondary aggregation, have excellent dispersion stability, and are suitable for polishing. Another object of the present invention is to provide a polishing method suitable for polishing, a method for producing a semiconductor wafer including the polishing method, and a method for producing a semiconductor device including the polishing method.

Solution to Problem

As a result of intensive studies, the present inventors have found that the problems described above can be solved by increasing a circularity coefficient of silica particles, and have completed the present invention.

That is, the gist of the present invention is as follows.

[1] A silica particle in which an average value of a circularity coefficient measured by a field-emission scanning electron microscope is 0.90 or more, and a standard deviation of the circularity coefficient is 0.05 or less.

[2] A silica particle in which an average value of a circularity coefficient measured by a field-emission scanning electron microscope is 0.90 or more, and an average value of a Heywood diameter measured by a field-emission scanning electron microscope is 30 nm or less.

[3] A silica particle in which an average value of a circularity coefficient measured by a field-emission scanning electron microscope is 0.90 or more, and an average value of an aspect ratio measured by a field-emission scanning electron microscope is 1.20 or less.

[4] The silica particle according to any one of [1] to [3], in which an average value of a Heywood diameter measured by a field-emission scanning electron microscope is 20 nm or less.

[5] The silica particle according to [1], [2] or [4], in which an average value of an aspect ratio measured by a field-emission scanning electron microscope is 1.20 or less.

[6] The silica particle according to [4], in which a standard deviation of the Heywood diameter is 3.00 nm or less.

[7] The silica particle according to [5], in which a standard deviation of the aspect ratio is 0.15 or less.

[8] The silica particle according to any one of [1] to [7], in which a content of metal impurity is 5 ppm or less.

[9] The silica particle according to any one of [1] to [8] containing a tetraalkoxysilane condensate as a main component.

[10] A silica sol containing the silica particle according to any one of [1] to [9].

[11] A polishing composition containing the silica sol according to [10].

[12] A polishing method, containing polishing using the polishing composition according to [11].

[13] A method for producing a semiconductor wafer, containing polishing using the polishing composition according to [11].

[14] A method for producing a semiconductor device, containing polishing using the polishing composition according to [11].

Advantageous Effects of Invention

Silica particles of the present invention prevent secondary aggregation and have excellent dispersion stability. When the silica particles are used as a polishing composition, an object to be polished having a smooth surface is obtained, and the stability of the polishing performance is excellent. In addition, a silica sol of the present invention prevents secondary aggregation of silica particles and has excellent dispersion stability. When the silica sol is used as a polishing composition, an object to be polished having a smooth surface is obtained, and the stability of the polishing performance is excellent. Furthermore, a polishing composition of the present invention provides a polished body having a smooth surface, and is excellent in the stability of the polishing performance.

A polishing method of the present invention is suitable for polishing. In addition, since a method for producing a semiconductor wafer and a method for producing a semiconductor device of the present invention include the polishing method of the present invention, the production stability of an object to be polished is excellent.

DESCRIPTION OF EMBODIMENTS

Although the present invention is hereunder specifically described, it should not be construed that the present invention is limited to the following embodiments, and the present invention can be carried out by making various changes within the scope of a gist thereof. In this specification, the expression "to" is used as an expression including numerical values or physical property values before and after the expression.

(Silica Particles)

In silica particles of the present invention, an average value of a circularity coefficient measured by a field-emission scanning electron microscope is 0.90 or more. When the average value of the circularity coefficient of the silica particles of the present invention is 0.90 or more, the secondary aggregation of the silica particles is prevented, the dispersion stability of the silica particles in a dispersion liquid is excellent, and an object to be polished having a smooth surface is obtained and the silica particles are excellent in the stability of the polishing performance in the case where the silica particles are used as a polishing composition.

The average value of the circularity coefficients of the silica particles of the present invention is preferably 0.90 to 0.99, and more preferably 0.92 to 0.98. As described above, when the average value of the circularity coefficient of the silica particles of the present invention is 0.90 or more, the secondary aggregation of the silica particles is prevented, the dispersion stability of the silica particles in a dispersion liquid is excellent, and an object to be polished having a smooth surface is obtained and the silica particles are excellent in the stability of the polishing performance in the case where the silica particles are used as a polishing composition. When the average value of the circularity coefficient of the silica particles is 0.99 or less, the silica particles can be easily produced.

A standard deviation of the circularity coefficient of the silica particles of the present invention is preferably 0.05 or less, more preferably 0.01 to 0.05, and still more preferably 0.02 to 0.04. When the standard deviation of the circularity coefficient of the silica particles of the present invention is 0.05 or less, the secondary aggregation of the silica particles is prevented, the dispersion stability of the silica particles in a dispersion liquid is excellent, and an object to be polished having a smooth surface is obtained and the silica particles are excellent in the stability of the polishing performance in the case where the silica particles are used as a polishing composition. When the standard deviation of the circularity coefficient of the silica particles of the present invention is 0.01 or more, the silica particles can be easily produced.

An average value of a Heywood diameter of the silica particles of the present invention is preferably 30 nm or less, more preferably from 5 nm to 20 nm, and still more preferably from 6 nm to 19 nm. When the average value of the Heywood diameter of the silica particles of the present invention is 30 nm or less, an object to be polished having a smooth surface is obtained and the silica particles are excellent in the stability of the polishing performance in the case where the silica particles are used as a polishing composition. When the average value of the Heywood diameter of the silica particles of the present invention is 5 nm or more, the storage stability of a silica sol is excellent.

The standard deviation of the Heywood diameter of the silica particles of the present invention is preferably 3.00 nm or less, more preferably 0.10 nm to 3.00 nm, and still more preferably 0.50 nm to 2.50 nm. When the standard deviation of the Heywood diameter of the silica particles of the present invention is 3.00 nm or less, the secondary aggregation of the silica particles is prevented, the dispersion stability of the silica particles in a dispersion liquid is excellent, and an object to be polished having a smooth surface is obtained and the silica particles are excellent in the stability of the polishing performance in the case where the silica particles are used as a polishing composition. When the standard deviation of the Heywood diameter of the silica particles of the present invention is 0.10 nm or more, the silica particles can be easily produced.

An average value of a major axis of the silica particles of the present invention is preferably 31 nm or less, more preferably 6 nm to 21 nm, and still more preferably 7 nm to 20 nm. When the average value of the major axis of the silica particles of the present invention is 6 nm or more, the storage stability of the silica sol is excellent. In addition, when the average value of the major axis of the silica particles of the present invention is 31 nm or less, an object to be polished having a smooth surface is obtained and the silica particles are excellent in the stability of the polishing performance in the case where the silica particles are used as a polishing composition.

An average value of a minor axis of the silica particles of the present invention is preferably 29 nm or less, more preferably 4 nm to 19 nm, and still more preferably 5 nm to 18 nm. When the average value of the minor axis of the silica particles of the present invention is 4 nm or more, the storage stability of the silica sol is excellent. In addition, when the average value of the minor axis of the silica particles of the present invention is 29 nm or less, an object to be polished having a smooth surface is obtained and the silica particles are excellent in the stability of the polishing performance in the case where the silica particles are used as a polishing composition.

An average value of an aspect ratio of the silica particles of the present invention is preferably 1.20 or less, more preferably 1.01 to 1.20, and still more preferably 1.02 to 1.18. When the average value of the aspect ratio of the silica particles of the present invention is 1.20 or less, the secondary aggregation of the silica particles is prevented, the dispersion stability of the silica particles in a dispersion liquid is excellent, and an object to be polished having a smooth surface is obtained and the silica particles are excellent in the stability of the polishing performance in the case where the silica particles are used as a polishing composition. When the average value of the aspect ratio of the silica particles of the present invention is 1.01 or more, the silica particles can be easily produced.

A standard deviation of the aspect ratio of the silica particles of the present invention is preferably 0.15 or less, more preferably 0.01 to 0.15, and still more preferably 0.02 to 0.14. When the standard deviation of the aspect ratio of the silica particles of the present invention is 0.15 or less, the secondary aggregation of the silica particles is prevented, the dispersion stability of the silica particles in a dispersion liquid is excellent, and an object to be polished having a smooth surface is obtained and the silica particles are excellent in the stability of the polishing performance in the case where the silica particles are used as a polishing composition. When the standard deviation of the aspect ratio of the silica particles of the present invention is 0.01 or more, the silica particles can be easily produced.

The average values of the circularity coefficient, the Heywood diameter, the major axis, the minor axis, and the aspect ratio of the silica particles of the present invention and the standard deviations thereof are measured by a field-emission scanning electron microscope. Specifically, the measurement and calculation are performed under the following conditions.

A dispersion liquid of the silica particles is dropped onto a silicon substrate and dried, and the silicon substrate is irradiated with an electron beam at an accelerating voltage of 5 kV using the field-emission scanning electron microscope. Then, a secondary electron image is photographed at a magnification of 50000 to 200000 times so that the total number of silica particles is 80 or more. The Heywood diameter, the major axis, the minor axis, the circularity coefficient, and the aspect ratio of all the silica particles are measured, and the average values and the standard deviations thereof are calculated. At this time, a concentration of the silica particles in the dispersion liquid may be appropriately adjusted.

A shape of the silica particles is determined as described later. Whether two or more silica particles are bonded to each other is determined as individual silica particles which are not bonded to each other when a black line is visible between the silica particles, and is determined as one bonded silica particle when a black line is not visible between the silica particles. In the case where three or more silica particles are aggregated, they are excluded from the measurement because they are difficult to determine.

The reason why the magnification of the field-emission scanning electron microscope is set to 50000 to 200000 times is that the shape of each silica particle of 30 nm or less can be identified.

The circularity coefficient is a numerical value calculated by $4\pi S/L^2$, where S is an area of the secondary electron image of the silica particles photographed by the field-emission scanning electron microscope and L is a perimeter of the secondary electron image.

The Heywood diameter is defined as a diameter of a circle having the same area as that of the secondary electron image.

The major axis is defined as a long side of a quadrangle circumscribing the secondary electron image having the smallest area.

The minor axis is defined as a short side of a quadrangle circumscribing the secondary electron image having the smallest area.

The aspect ratio is a numerical value calculated by $D_L/D_S$, where $D_L$ is the long side of the quadrangle circumscribing the secondary electron image having the smallest area, and $D_S$ is the short side of the quadrangle circumscribing the secondary electron image having the smallest area.

A content of metal impurity of the silica particles of the present invention is preferably 5 ppm or less, and more preferably 2 ppm or less.

In polishing of a silicon wafer of a semiconductor device, the metal impurity adheres to and contaminates a surface of the object to be polished, which adversely affects wafer characteristics, and the metal impurity disperses into the wafer to deteriorate quality. Therefore, performance of the semiconductor device manufactured by such wafers is significantly reduced.

When the metal impurity is present in the silica particles of the present invention, a coordination interaction occurs between the silanol groups on the surface exhibiting acidity and the metal impurity, chemical properties (acidity and the like) of the silanol group on the surface are changed, a three-dimensional environment (ease of aggregation of the silica particles and the like) of the surfaces of the silica particles is changed, and the polishing rate is affected.

The content of the metal impurity of the silica particles is measured by inductively coupled plasma mass spectrometry (ICP-MS). Specifically, a silica sol containing 0.4 g of the silica particles is accurately weighed, and sulfuric acid and hydrofluoric acid are added thereto. The mixture is heated, dissolved, and evaporated. Then, pure water is added to the remaining sulfuric acid droplets so that a total amount is accurately 10 g to prepare a test solution. The test solution is measured using an inductively coupled plasma mass spectrometer. A target metal is sodium, potassium, iron, aluminum, calcium, magnesium, zinc, cobalt, chromium, copper, manganese, lead, titanium, silver, or nickel. A total content of these metals is defined as the content of the metal impurity.

The content of the metal impurity of the silica particles of the present invention may be 5 ppm or less by performing the hydrolysis reaction and the condensation reaction using alkoxysilane as a main raw material to obtain the silica particles.

In a method for deionization of alkali silicate such as water glass, sodium or the like derived from the raw material remains, and thus it is extremely difficult to set the content of the metal impurity of the silica particles to 5 ppm or less.

The silica particles of the present invention preferably have no pores due to the excellent mechanical strength and storage stability.

The presence or absence of pores in the silica particles is confirmed by BET multipoint analysis using an adsorption isotherm using nitrogen as an adsorption gas.

The silica particles of the present invention preferably contain an alkoxysilane condensate as a main component, and more preferably contain a tetraalkoxysilane condensate as a main component due to the excellent mechanical strength and storage stability. The main component is defined as being 50 mass % or more, based on 100 mass % of total components of the silica particles.

In order to obtain silica particles containing an alkoxysilane condensate as a main component, it is preferable to use alkoxysilane as the main raw material. In order to obtain silica particles containing a tetraalkoxysilane condensate as a main component, it is preferable to use tetraalkoxysilane as the main raw material. The main raw material is defined as being 50 mass % or more, based on 100 mass % of total raw materials of the silica particles.

(Method for Producing Silica Particles)

The silica particles of the present invention can be obtained, for example, by adding a solution (B) containing tetraalkoxysilane and a solution (C) containing an alkali catalyst to a solution (A) containing water, and subjecting the tetraalkoxysilane to a hydrolysis reaction and a condensation reaction.

The solution (A) contains water.

The solution (A) preferably contains a solvent other than water because of excellent dispersibility of tetraalkoxysilane in the reaction solution.

Examples of the solvent other than water in the solution (A) include methanol, ethanol, propanol, isopropanol, ethylene glycol, etc. These solvents may be used alone or in combination of two or more kinds thereof. Among these solvents, monohydric alcohol is preferable, methanol and ethanol are more preferable, and methanol is still more preferable, because tetraalkoxysilane is easily dissolved, those used in the hydrolysis reaction and the condensation reaction are the same as those produced as a by-product, and are excellent in convenience in production.

The solution (A) preferably contains an alkali catalyst because a reaction rate of tetraalkoxysilane in the hydrolysis reaction and the condensation reaction can be increased.

Examples of the alkali catalyst in the solution (A) include ethylenediamine, diethylenetriamine, triethylenetetramine, ammonia, urea, ethanolamine, tetramethyl ammonium hydroxide, etc. These alkali catalysts may be used alone or in combination of two or more kinds thereof. Among these alkali catalysts, ammonia is preferable because a catalytic action is excellent, the particle shape is easily controlled, mixing of the metal impurity can be prevented, volatility is high, and removability after the hydrolysis reaction and the condensation reaction is excellent.

A concentration of water in the solution (A) is preferably 3 mass % to 30 mass %, and more preferably 5 mass % to 25 mass %, based on 100 mass % of the solution (A). When the concentration of water in the solution (A) is 3 mass % or more, it is easy to control a hydrolysis reaction rate of tetraalkoxysilane. When the concentration of water in the solution (A) is 30 mass % or less, the reaction balance between the hydrolysis reaction and the condensation reaction is good, and the particle shape is easily controlled.

A concentration of the alkali catalyst in the solution (A) is preferably 0.5 mass % to 2.0 mass %, and more preferably 0.6 mass % to 1.5 mass %, based on 100 mass % of the solution (A). When the concentration of the alkali catalyst in the solution (A) is 0.5 mass % or more, the aggregation of the silica particles is prevented, and the dispersion stability of the silica particles in the dispersion liquid is excellent. When the concentration of the alkali catalyst in the solution (A) is 2.0 mass % or less, the reaction does not proceed excessively fast, and the reaction controllability is excellent.

A concentration of the solvent other than water in the solution (A) is preferably the balance of water and the alkali catalyst.

Examples of the tetraalkoxysilane in the solution (B) include tetramethoxysilane, tetraethoxysilane, tetrapropoxysilane, tetraisopropoxysilane, etc. These tetraalkoxysilanes may be used alone or in combination of two or more kinds thereof. Among these tetraalkoxysilanes, tetramethoxysilane and tetraethoxysilane are preferable, and tetramethoxysilane is more preferable, because the hydrolysis reaction is fast, an unreacted material hardly remains, the productivity is excellent, and a stable silica sol can be easily obtained.

As the raw material of the silica particles of the present invention, a raw material other than the tetraalkoxysilane, such as a low condensate of tetraalkoxysilane may be used. From the viewpoint of excellent reactivity, it is preferable that the amount of the tetraalkoxysilane is 50 mass % or more and the amount of the raw material other than the tetraalkoxysilane is 50 mass % or less, and it is more preferable that the amount of the tetraalkoxysilane is 90 mass % or more and the amount of the raw material other than the tetraalkoxysilane is 10 mass % or less, based on 100 mass % of all raw materials constituting the silica particles.

The solution (B) may contain only tetraalkoxysilane without containing a solvent, but preferably contains a solvent because the dispersibility of tetraalkoxysilane is excellent in the reaction liquid.

Examples of the solvent in the solution (B) include methanol, ethanol, propanol, isopropanol, ethylene glycol, etc. These solvents may be used alone or in combination of two or more kinds thereof. Among these solvents, monohydric alcohol is preferable, methanol and ethanol are more preferable, and methanol is still more preferable, because those used in the hydrolysis reaction and the condensation reaction are the same as those produced as a by-product and, are excellent in convenience in production.

A concentration of the tetraalkoxysilane in the solution (B) is preferably 60 mass % to 95 mass %, and more preferably 70 mass % to 90 mass %, based on 100 mass % of the solution (B). When the concentration of the tetraalkoxysilane in the solution (B) is 60 mass % or more, the reaction liquid is likely to be uniform. In addition, when the concentration of the tetraalkoxysilane in the solution (B) is 95 mass % or less, the generation of a gel can be prevented.

A concentration of the solvent in the solution (B) is preferably 5 mass % to 40 mass %, and more preferably 10 mass % to 30 mass %, based on 100 mass % of the solution (B). When the concentration of the solvent in the solution (B) is 5 mass % or more, the generation of a gel can be prevented. When the concentration of the solvent in the solution (B) is 40 mass % or less, the reaction liquid is likely to be uniform.

An addition rate of the solution (B) per hour with respect to a volume of the solution (A) is preferably 0.05 kg/hour/L to 1.3 kg/hour/L, and more preferably 0.1 kg/hour/L to 0.8 kg/hour/L. When the addition rate of the solution (B) is 0.05 kg/hour/L or more, the productivity of the silica particles is excellent. In addition, when the addition rate of the solution (B) is 1.3 kg/hour/L or less, the generation of a gel can be prevented.

Examples of the alkali catalyst in the solution (C) include ethylenediamine, diethylenetriamine, triethylenetetramine, ammonia, urea, ethanolamine, tetramethyl ammonium hydroxide, etc. These alkali catalysts may be used alone or in combination of two or more kinds thereof. Among these alkali catalysts, ammonia is preferable because a catalytic action is excellent, the particle shape is easily controlled, mixing of the metal impurity can be prevented, volatility is high, and removability after the hydrolysis reaction and the condensation reaction is excellent.

The solution (C) preferably contains a solvent because the variation in the concentration of the alkali catalyst in the reaction liquid can be reduced.

Examples of the solvent in the solution (C) include water, methanol, ethanol, propanol, isopropanol, ethylene glycol, etc. These solvents may be used alone or in combination of two or more kinds thereof. Among these solvents, water and monohydric alcohol are preferable, and water is more preferable, because those used in the hydrolysis reaction and the condensation reaction are the same as those produced as a by-product, and are excellent in convenience in production.

The concentration of the alkali catalyst in the solution (C) is preferably 0.5 mass % to 10 mass %, and more preferably 1 mass % to 6 mass %, based on 100 mass % of the solution (C). When the concentration of the alkali catalyst in the solution (C) is 0.5 mass % or more, it is easy to adjust the concentration of the alkali catalyst in the reaction liquid from the start of the reaction to the end of the reaction. When the concentration of the alkali catalyst in the solution (C) is 10 mass % or less, the variation in the concentration of the alkali catalyst in the reaction liquid can be reduced.

The concentration of the solvent in the solution (C) is preferably 90 mass % to 99.5 mass %, and more preferably 94 mass % to 99 mass %, based on 100 mass % of the solution (C). When the concentration of the solvent in the solution (C) is 90 mass % or more, the variation in the concentration of the alkali catalyst in the reaction liquid can be reduced. When the concentration of the solvent in the solution (C) is 99.5 mass % or less, it is easy to adjust the concentration of the alkali catalyst in the reaction liquid from the start of the reaction to the end of the reaction.

An addition rate of the solution (C) per hour with respect to a volume of the solution (A) is preferably 0.02 kg/hour/L to 0.5 kg/hour/L, and more preferably 0.04 kg/hour/L to 0.3 kg/hour/L. When the addition rate of the solution (C) is 0.02 kg/hour/L or more, the productivity of the silica particles is excellent. In addition, when the addition rate of the solution (C) is 0.5 kg/hour/L or less, the generation of a gel can be prevented.

The addition of the solution (B) and the solution (C) is preferably performed in the solution (A). By adding the solution (B) and the solution (C) to the solution (A), the mixability of each component in the reaction liquid increases, an abnormal reaction in the air can be prevented, and the circularity coefficient and the particle diameter can be easily controlled when an alkaline catalyst having high volatility and typified by ammonia is desired to be used, and when a hydrolysis reaction and a condensation reaction are desired to proceed at a high reaction temperature. Adding to the liquid means adding to the liquid level or lower. By setting a supply outlet of the solution (B) and a supply outlet of the solution (C) to be equal to or lower than a liquid level of the solution (A), the solution (B) and the solution (C) can be added to the liquid of the solution (A).

A timing of addition of the solution (B) and a timing of addition of the solution (C) may be the same or may be different alternately, but the same timing is preferred because the variation in a reaction solution composition is reduced and the operation is not complicated.

A reaction temperature of the hydrolysis reaction and the condensation reaction is preferably 50° C. to 80° C., and more preferably 55° C. to 75° C. When the reaction temperature is 50° C. or higher, it is easy to control the particle shape such as the Heywood diameter and the circularity coefficient. In addition, when the reaction temperature is 80° C. or less, bumping or volatilization of the solvent can be prevented, and the variation in a reaction solution composition set can be reduced.

A concentration of water in the reaction system of the hydrolysis reaction and the condensation reaction is preferably maintained at 3 mass % to 30 mass %, more preferably 5 mass % to 25 mass %, based on 100 mass % of the total amount in the reaction system. When the concentration of water in the reaction system is 3 mass % or more, it is easy to control the hydrolysis reaction rate of tetraalkoxysilane. When the concentration of water in the reaction system is 30 mass % or less, the reaction balance between the hydrolysis reaction and the condensation reaction is good, and the particle shape is easily controlled.

A concentration of the alkali catalyst in the reaction system of the hydrolysis reaction and the condensation reaction is preferably maintained at 0.5 mass % to 2.0 mass %, and more preferably maintained at 0.6 mass % to 1.5 mass %, based on 100 mass % of the total amount in the reaction system. When the concentration of the alkali catalyst in the reaction system is 0.5 mass % or more, the aggregation of the silica particles is prevented, and the dispersion stability of the silica particles in the dispersion liquid is excellent. When the concentration of the alkali catalyst in the reaction system is 2.0 mass % or less, the reaction does not proceed excessively fast, and the reaction controllability is excellent.

The method for producing silica particles of the present invention preferably further includes the following step (1) because unnecessary components can be removed and necessary components can be added.

Step (1): concentrating the obtained dispersion liquid of the silica particles and adding a dispersion medium Examples of the dispersion medium include water, methanol, ethanol, propanol, isopropanol, ethylene glycol, etc. These dispersion media may be used alone or in combination of two or more kinds thereof. Among these dispersion media, water and monohydric alcohol are preferable, and water is more preferable, because of excellent affinity with silica particles.

The method for producing silica particles of the present invention preferably further includes the following step (2) because the degree of condensation of the silica particles can be increased.

Step (2): subjecting the dispersion liquid of the silica particles obtained in step (1) to a pressurized heat treatment A pressure of the pressurized heat treatment is preferably 0.10 MPa to 2.3 MPa, and more preferably 0.14 MPa to 1.0 MPa. When the pressure of the pressurized heat treatment is 0.10 MPa or more, the degree of condensation of the silica particles can be increased. When the pressure of the pressurized heat treatment is 2.3 MPa or less, the silica particles can be produced without greatly changing an average primary particle diameter, an average secondary particle diameter, a cv value, and an association ratio, and the dispersion stability of the silica sol is excellent.

For pressurization, the dispersion liquid of the silica particles may be heated to a temperature equal to or higher than the boiling point of the dispersion medium in a sealed state. When the aqueous dispersion liquid of the silica particles is heated to 100° C. or higher in a sealed state, the pressure becomes a saturated water vapor pressure at that temperature.

A temperature of the pressurized heat treatment is preferably 100° C. to 220° C., and more preferably 110° C. to 180° C. When the temperature of the pressurized heat treatment is 100° C. or higher, the degree of condensation of the silica particles can be increased. When the temperature of the pressurized heat treatment is 220° C. or less, the silica particles can be produced without greatly changing the average primary particle diameter, the average secondary particle diameter, the cv value, and the association ratio, and the dispersion stability of the silica sol is excellent.

A time of the pressurized heat treatment is preferably 0.25 hours to 10 hours, and more preferably 0.5 hours to 8 hours. When the time of the pressurized heat treatment is 0.25 hours or more, the degree of condensation of the silica particles can be increased. When the time of the pressurized heat treatment is 10 hours or less, the silica particles can be produced without greatly changing the average primary particle diameter, the average secondary particle diameter, the cv value, and the association ratio, and the dispersion stability of the silica sol is excellent.

The pressurized heat treatment is more preferably performed in an aqueous dispersion liquid since the degree of condensation of the silica particles can be increased without greatly changing the average primary particle diameter, the average secondary particle diameter, the cv value, and the association ratio.

A pH of the aqueous dispersion liquid at the time of performing the pressurized heat treatment in the aqueous dispersion liquid is preferably 6.0 to 8.0, and more preferably 6.5 to 7.8. When the pH of the aqueous dispersion liquid at the time of performing the pressurized heat treatment in the aqueous dispersion liquid is 6.0 or more, gelation of the silica sol can be prevented. In addition, when the pH of the aqueous dispersion liquid at the time of performing the pressurized heat treatment in the aqueous dispersion liquid is 8.0 or less, the degree of condensation of the silica particles can be increased without greatly changing the average primary particle diameter, the average secondary particle diameter, the cv value, and the association ratio.

(Silica Sol)

The silica sol of the present invention contains the silica particles of the present invention.

The silica sol may be produced by using the dispersion liquid of the silica particles of the present invention as it is, or by removing unnecessary components or adding necessary components among the components in the dispersion liquid of the silica particles of the present invention.

The silica sol of the present invention preferably contains the silica particles of the present invention and a dispersion medium.

Examples of the dispersion medium in the silica sol of the present invention include water, methanol, ethanol, propanol, isopropanol, ethylene glycol, etc. These dispersion media in the silica sol may be used alone or in combination of two or more kinds thereof. Among these dispersion media in the silica sol, water and monohydric alcohol are preferable, and water is more preferable, because of excellent affinity with silica particles.

The content of the silica particles in the silica sol of the present invention is preferably 3 mass % to 50 mass %, more preferably 4 mass % to 40 mass %, and still more preferably 5 mass % to 30 mass %, based on 100 mass % of the total amount of the silica sol. When the content of the silica particles in the silica sol of the present invention is 3 mass % or more, a polishing rate for an object to be polished typified by a silicon wafer is excellent. When the content of the silica particles in the silica sol of the present invention is 50 mass % or less, the aggregation of the silica particles in the silica sol or the polishing composition can be prevented, and storage stability of the silica sol or the polishing composition is excellent.

The content of the dispersion medium in the silica sol of the present invention is preferably 50 mass % to 97 mass %, more preferably 60 mass % to 96 mass %, and still more preferably 70 mass % to 95 mass %, based on 100 mass % of the total amount of the silica sol. When the content of the dispersion medium in the silica sol of the present invention is 50 mass % or more, the aggregation of the silica particles in the silica sol or the polishing composition can be prevented, and storage stability of the silica sol or the polishing composition is excellent. When the content of the dispersion medium in the silica sol of the present invention is 97 mass % or less, the polishing rate for the object to be polished typified by a silicon wafer is excellent.

The content of the silica particles and the dispersion medium in the silica sol of the present invention can be set to a desired range by removing unnecessary components from the components in the obtained dispersion liquid of the silica particles and adding necessary components.

The silica sol of the present invention may contain, in addition to the silica particles and the dispersion medium, other components such as an oxidizing agent, a preservative, an antifungal agent, a pH adjusting agent, a pH buffering agent, a surfactant, a chelating agent, and an antimicrobial and biocide, if necessary, as long as the performance of the silica sol is not impaired.

In particular, it is preferable to contain an antimicrobial and biocide in the silica sol because of excellent storage stability of the silica sol.

Examples of the antimicrobial and biocide include hydrogen peroxide, ammonia, quaternary ammonium hydroxide, quaternary ammonium salt, ethylenediamine, glutaraldehyde, hydrogen peroxide, methyl p-hydroxybenzoate, sodium chlorite, etc. These antimicrobial and biocides may be used alone or in combination of two or more kinds thereof. Among these antimicrobial and biocides, hydrogen peroxide is preferable because of excellent affinity with a silica sol.

The biocide includes those generally referred to as bactericides.

The content of the antimicrobial and biocide in the silica sol of the present invention is preferably 0.0001 mass % to 10 mass %, and more preferably 0.001 mass % to 1 mass %, based on 100 mass % of the total amount of the silica sol. When the content of the antimicrobial and biocide in the silica sol of the present invention is 0.0001 mass % or more, the storage stability of the silica sol is excellent. When the content of the antimicrobial and biocide in the silica sol of the present invention is 10 mass % or less, the original performance of the silica sol is not impaired.

A pH of the silica sol of the present invention is preferably 6.0 to 8.0, and more preferably 6.5 to 7.8. When the pH of the silica sol of the present invention is 6.0 or more, the dispersion stability is excellent, and the aggregation of the silica particles can be prevented. When the pH of the silica sol of the present invention is 8.0 or less, the silica particles are prevented from being dissolved, and the storage stability for a long period of time is excellent.

The pH of the silica sol of the present invention can be set to a desired range by adding a pH adjusting agent.

(Polishing Composition)

A polishing composition of the present invention contains the silica sol of the present invention.

The polishing composition of the present invention preferably contains the silica sol of the present invention and a water-soluble polymer.

The water-soluble polymer enhances wettability of the polishing composition with respect to the object to be polished typified by a silicon wafer. The water-soluble polymer is preferably a polymer having a functional group having high hydrophilicity, affinity between the functional group having high hydrophilicity and the silanol group on the surfaces of the silica particles is high, and the silica particles and the water-soluble polymer are stably dispersed in the vicinity in the polishing composition. Therefore, when polishing the object to be polished typified by a silicon wafer, the effects of the silica particles and the water-soluble polymer synergistically function.

Examples of the water-soluble polymer include a cellulose derivative, polyvinyl alcohol, polyvinylpyrrolidone, a copolymer having a polyvinylpyrrolidone skeleton, a polymer having a polyoxyalkylene structure, etc.

Examples of the cellulose derivative include hydroxyethyl cellulose, hydroxyethylcellulose which has been subjected to a hydrolysis treatment, hydroxypropylcellulose, hydroxyethylmethyl cellulose, hydroxypropylmethyl cellulose, methyl cellulose, ethyl cellulose, ethylhydroxyethyl cellulose, carboxymethyl cellulose, etc.

Examples of the copolymer having a polyvinylpyrrolidone skeleton include graft copolymers of polyvinyl alcohol and polyvinylpyrrolidone, etc.

Examples of the polymer having a polyoxyalkylene structure include polyoxyethylene, polyoxypropylene, a copolymer of ethylene oxide and propylene oxide, etc.

These water-soluble polymers may be used alone or in combination of two or more kinds thereof. Among these water-soluble polymers, cellulose derivatives are preferred, and hydroxyethyl cellulose is more preferred, since the affinity with the silanol groups on the surfaces of the silica particles is high and good hydrophilicity to the surface of the object to be polished is imparted by synergetic action.

A weight average molecular weight of the water-soluble polymer is preferably 1000 to 3000000, more preferably 5000 to 2000000, and still more preferably 10000 to 1000000. When the weight average molecular weight of the water-soluble polymer is 1000 or more, the hydrophilicity of the polishing composition is improved. In addition, when the weight average molecular weight of the water-soluble polymer is 3000000 or less, the affinity with a silica sol is excellent, and the polishing rate for the object to be polished typified by a silicon wafer is excellent.

The weight average molecular weight of the water-soluble polymer is measured by size exclusion chromatography under conditions that a NaCl solution of 0.1 mol/L in terms of polyethylene oxide is used as a mobile phase.

The content of the water-soluble polymer in the polishing composition is preferably 0.02 mass % to 10 mass %, and more preferably 0.05 mass % to 5 mass %, based on 100 mass % of the total amount of the polishing composition. When the content of the water-soluble polymer in the polishing composition is 0.02 mass % or more, the hydrophilicity of the polishing composition is improved. When the content of the water-soluble polymer in the polishing composition is 10 mass % or less, the aggregation of the silica particles during preparation of the polishing composition can be prevented.

The polishing composition of the present invention may contain, in addition to the silica sol and the water-soluble polymer, other components such as a basic compound, a polishing accelerator, a surfactant, a hydrophilic compound, a preservative, an antifungal agent, a pH adjusting agent, a pH buffering agent, a surfactant, a chelating agent, and an antimicrobial and biocide, if necessary, as long as the performance of the polishing composition is not impaired.

In particular, the basic compound is preferably contained in the polishing composition since chemical polishing (chemical etching) can be performed by imparting a chemical action to the surface of the object to be polished typified by a silicon wafer, and the polishing rate for the object to be polished typified by a silicon wafer can be improved by a synergistic effect with the silanol groups on the surfaces of the silica particles.

Examples of the basic compound include an organic basic compound, an alkali metal hydroxide, an alkali metal hydrogen carbonate, an alkali metal carbonate, ammonia, etc. These basic compounds may be used alone or in combination of two or more kinds thereof. Among these basic compounds, ammonia, tetramethylammonium hydroxide, tetraethylammonium hydroxide, ammonium hydrogen carbonate, and ammonium carbonate are preferred, ammonia, tetramethylammonium hydroxide, and tetraethylammonium hydroxide are more preferred, and ammonia is still more preferred, because water solubility is high and affinity between the silica particles and the water-soluble polymers is excellent.

A content of the basic compound in the polishing composition of the present invention is preferably 0.001 mass % to 5 mass %, and more preferably 0.01 mass % to 3 mass %, based on 100 mass % of the total amount of the polishing composition. When the content of the basic compound in the polishing composition is 0.001 mass % or more, the polishing rate of the object to be polished typified by a silicon wafer can be improved. When the content of the basic compound in the polishing composition is 5 mass % or less, the stability of the polishing composition is excellent.

A pH of the polishing composition of the present invention is preferably 8.0 to 12.0, and more preferably 9.0 to 11.0. When the pH of the polishing composition is 8.0 or more, the aggregation of the silica particles in the polishing composition can be prevented, and the dispersion stability of the polishing composition is excellent. When the pH of the polishing composition of the present invention is 12.0 or less, the dissolution of the silica particles can be prevented, and the stability of the polishing composition is excellent.

The pH of the polishing composition of the present invention can be set to a desired range by adding a pH adjusting agent.

The polishing composition of the present invention can be obtained by mixing the silica sol of the present invention and, if necessary, a water-soluble polymer and other components. Considering storage and transportation, the polishing composition may be prepared at a high concentration once and diluted with water or the like immediately before polishing.

(Polishing Method)

The polishing method of the present invention is a method including polishing using the polishing composition containing the silica sol obtained by the method for producing a silica sol of the present invention.

As the polishing composition, the polishing composition of the present invention described above is preferably used.

Specific examples of the polishing method include a method in which a surface of a silicon wafer is pressed against a polishing pad, the polishing composition of the present invention is dropped onto the polishing pad, and the surface of the silicon wafer is polished.

(Method for Producing Semiconductor Wafer)

A method for producing a semiconductor wafer of the present invention is a method including the polishing method of the present invention, and a specific polishing method is as described above.

Examples of the semiconductor wafer include a silicon wafer, a compound semiconductor wafer, etc.

Method for Producing Semiconductor Device

A method for producing a semiconductor device of the present invention is a method including the polishing method of the present invention, and a specific polishing method is as described above.

(Use)

The silica particles of the present invention and the silica sol of the present invention can be suitably used for polishing applications. The silica particles of the present invention and the silica sol of the present invention, for example, can be used for polishing of a semiconductor material such as a silicon wafer, polishing of an electronic material such as a hard disk substrate, polishing (chemical mechanical polishing) in a planarization step in manufacturing an integrated circuit, polishing of a synthetic quartz glass substrate used for a photomask or liquid crystal, polishing of a magnetic disk substrate, and the like, and among them, can be particularly suitably used for polishing or chemical mechanical polishing of a silicon wafer.

Since the silica particles of the present invention are silica particles having a large circularity coefficient, the silica particles impart transparency and water repellency to the resin, and improve dispersibility and mixing properties to improve processability of the composite material when the silica particles are used as a composite material with a resin. Therefore, the silica particles of the present invention can also be suitably used as a hard coat agent, a coating material, and a binder for ceramics.

EXAMPLE

Hereinafter, the present invention will be described more specifically with reference to Examples. However, the present invention is not limited to the description of the following Examples as long as its gist is observed.

(Measurement of Shape of Silica Particles)

A dispersion liquid of silica particles obtained in Examples and Comparative Examples was diluted 5000 times with ultrapure water, and 5 μL of the diluted dispersion liquid of the silica particles was dropped onto a silicon substrate and dried. Next, the silicon substrate was irradiated with an electron beam at an acceleration voltage of 5 kV using a field-emission scanning electron microscope (model name "S-5200", manufactured by Hitachi High-Tech Corporation, FE-SEM). A secondary electron image was photographed at a magnification of 50000 to 200000 times so that a total number of silica particles was 80 or more. A Heywood diameter, a major axis, a minor axis, a circularity coefficient, and an aspect ratio of all the silica particles were measured, and average values and standard deviations thereof were measured.

In the measurement of the shape of the silica particles, the photographed field-emission scanning electron micrograph was taken in image analysis type particle size distribution measurement software (software name "Mac-View Ver.4", manufactured by Mountech Co., Ltd.).

The shape of the silica particles was determined as described later. Whether two or more silica particles are bonded to each other was determined as individual silica particles which are not bonded to each other when a black line is visible between the silica particles, and was determined as one bonded silica particle when a black line is not visible between the silica particles. In the case where three or more silica particles are aggregated, they were excluded from the measurement because they are difficult to determine.

Example 1

A solution (A1) was obtained by mixing 34.2 parts by mass of pure water, 188.3 parts by mass of methanol, and 8.8 parts by mass of 29 mass % ammonia water. A solution (B1) obtained by mixing 100 parts by mass of tetramethoxysilane and 33.3 parts by mass of methanol and a solution (C1) obtained by mixing 25.0 parts by mass of pure water and 2.2 parts by mass of 29 mass % ammonia water were added to the solution (A1) at a constant speed over 103 minutes, respectively. During the addition, stirring of the reaction liquid was continued while maintaining a temperature of the reaction liquid at 70° C. After the completion of the addition, the reaction liquid was further stirred for 30 minutes while maintaining the temperature of the reaction solution at 70° C.

The obtained dispersion liquid of silica particles is subjected to removal of methanol and ammonia by increasing the temperature while adjusting a liquid amount by adding pure water so that the content of the silica particles is about 20 mass %, and thus a dispersion liquid of the silica particles having a content of the silica particles of about 20 mass % was obtained.

The evaluation results of the obtained silica particles are shown in Table 1.

Example 2

An operation is performed in the same manner as in Example 1 except that a temperature of a reaction liquid is set to 60° C., and a dispersion liquid of silica particles having a content of the silica particles of about 20 mass % was obtained.

The evaluation results of the obtained silica particles are shown in Table 1.

Example 3

A solution (A3) was obtained by mixing 40.6 parts by mass of pure water, 207.6 parts by mass of methanol, and 5.2 parts by mass of 29 mass % ammonia water. A solution (B3) obtained by mixing 100 parts by mass of tetramethoxysilane and 17.6 parts by mass of methanol and a solution (C3) obtained by mixing 21.5 parts by mass of pure water and 2.1 parts by mass of 29 mass % ammonia water are added to the solution (A3) at a constant speed over 93 minutes, respectively. During the addition, stirring of the reaction liquid was continued while maintaining a temperature of the reaction liquid at 50° C. After the completion of the addition, the reaction liquid was further stirred for 30 minutes while maintaining the temperature of the reaction liquid at 50° C.

The obtained dispersion liquid of silica particles is subjected to removal of methanol and ammonia by increasing the temperature while adjusting a liquid amount by adding pure water so that the content of the silica particles is about 20 mass %, and thus a dispersion liquid of the silica particles having a content of the silica particles of about 20 mass % was obtained.

The evaluation results of the obtained silica particles are shown in Table 1.

Example 4

A solution (A4) was obtained by mixing 34.9 parts by mass of pure water, 204.4 parts by mass of methanol, and 13.1 parts by mass of 29 mass % ammonia water. A solution (B4) obtained by mixing 100 parts by mass of tetramethoxysilane and 17.6 parts by mass of methanol and a solution (C4) obtained by mixing 19.4 parts by mass of pure water and 5.3 parts by mass of 29 mass % ammonia water were added to the solution (A4) at a constant speed over 94 minutes, respectively. During the addition, stirring of the reaction liquid was continued while maintaining a temperature of the reaction liquid at 70° C. After the completion of the addition, the reaction liquid was further stirred for 30 minutes while maintaining the temperature of the reaction solution at 70° C.

The obtained dispersion liquid of silica particles is subjected to removal of methanol and ammonia by increasing the temperature while adjusting a liquid amount by adding pure water so that the content of the silica particles is about 20 mass %, and thus a dispersion liquid of the silica particles having a content of the silica particles of about 20 mass % was obtained.

The evaluation results of the obtained silica particles are shown in Table 1.

Comparative Example 1

A commercially available silica particle dispersion liquid (trade name "PL-1", manufactured by Fuso Chemical Co., Ltd.) was used as it was.

The evaluation results of the used silica particles are shown in Table 1.

Comparative Example 2

A commercially available silica particle dispersion liquid (trade name "PL-2", manufactured by Fuso Chemical Co., Ltd.) was used as it was.

The evaluation results of the used silica particles are shown in Table 1.

Comparative Example 3

A commercially available silica particle dispersion liquid (trade name "PL-2L", manufactured by Fuso Chemical Co., Ltd.) was used as it was.

The evaluation results of the used silica particles are shown in Table 1.

Comparative Example 4

A solution (A'4) was obtained by mixing 21.4 parts by mass of pure water, 95.2 parts by mass of methanol, and 3.7 parts by mass of 29 mass % ammonia water. A solution (B'4) obtained by mixing 100 parts by mass of tetramethoxysilane and 17.6 parts by mass of methanol and a solution (C'4) obtained by mixing 21.9 parts by mass of pure water and 3.2 parts by mass of 29 mass % ammonia water are added to the solution (A'4) at a constant speed over 94 minutes, respectively. During the addition, stirring of the reaction liquid was continued while maintaining a temperature of the reaction liquid at 42° C. After the completion of the addition, the reaction liquid was further stirred for 30 minutes while maintaining the temperature of the reaction solution at 42° C.

The obtained dispersion liquid of silica particles is subjected to removal of methanol and ammonia by increasing the temperature while adjusting a liquid amount by adding pure water so that the content of the silica particles is about 20 mass %, and thus a dispersion liquid of the silica particles having a content of the silica particles of about 20 mass % was obtained.

The evaluation results of the obtained silica particles are shown in Table 1.

Comparative Example 5

An operation was performed in the same manner as in Example 1 except that the solution (B1) and the solution (C1) were added dropwise from above a liquid level of the solution (A1), not in the liquid of the solution (A1). However, since a large amount of silica particles adhered to an inner wall of a reaction vessel and a stirring blade, it became difficult to continue the subsequent operation.

TABLE 1

| | Circularity coefficient | | Heywood diameter | | Major axis | Minor axis | Aspect ratio | |
|---|---|---|---|---|---|---|---|---|
| | Average value [—] | Standard deviation [[—] | Average value [nm] | Standard deviation [nm] | Average value [nm] | Average value [nm] | Average value [[—] | Standard deviation [[—] |
| Example 1 | 0.93 | 0.03 | 16.4 | 1.89 | 17.9 | 15.1 | 1.19 | 0.15 |
| Example 2 | 0.93 | 0.03 | 17.9 | 2.40 | 19.1 | 16.6 | 1.15 | 0.13 |
| Example 3 | 0.94 | 0.02 | 14.7 | 1.34 | 15.5 | 13.8 | 1.13 | 0.11 |
| Example 4 | 0.95 | 0.04 | 16.9 | 1.80 | 17.6 | 16.0 | 1.10 | 0.09 |
| Comparative Example 1 | 0.61 | 0.07 | 28.1 | 5.80 | 34.6 | 24.3 | 1.42 | 0.28 |
| Comparative Example 2 | 0.85 | 0.08 | 39.1 | 5.89 | 44.1 | 35.5 | 1.24 | 0.23 |

TABLE 1-continued

| | Circularity coefficient | | Heywood diameter | | Major axis | Minor axis | Aspect ratio | |
|---|---|---|---|---|---|---|---|---|
| | Average value [—] | Standard deviation [[—] | Average value [nm] | Standard deviation [nm] | Average value [nm] | Average value [nm] | Average value [[—] | Standard deviation [[—] |
| Comparative Example 3 | 0.81 | 0.14 | 24.7 | 3.96 | 27.0 | 23.0 | 1.17 | 0.16 |
| Comparative Example 4 | 0.85 | 0.10 | 31.3 | 4.52 | 34.2 | 28.9 | 1.18 | 0.16 |
| Comparative Example 5 | Production impossible | | | | | | | |

As can be seen from Table 1, the silica particles obtained in Examples 1 to 4 have a larger average value of the circularity coefficient, a smaller average value of the Heywood diameter, a smaller average value of the major axis, a smaller average value of the minor axis, and a smaller average value of the aspect ratio, and also smaller standard deviations thereof than the commercially available silica particles in Comparative Examples 1 to 3 and the silica particles in Comparative Example 4, indicating that the silica particles have a small variation in particle shape and a small particle diameter.

Since the silica particles obtained in Examples 1 to 4 have a small variation in particle shape and a small particle diameter, it is expected that secondary aggregation is prevented and dispersion stability is excellent. In addition, since the silica particles obtained in Examples 1 to 4 have a small variation in particle shape and a small particle diameter, it is expected that an object to be polished having a smooth surface is obtained and the stability of the polishing performance is excellent when the silica particles were used as a polishing composition.

Further, the dispersion liquid of the silica particles obtained in Example 1 was evaluated in the same manner after 9 months of the production, but there was almost no change, no secondary aggregation was confirmed, and the dispersion stability was excellent.

While the present invention has been described in detail with reference to specific embodiments, it will be apparent to those skilled in the art that various changes and modifications can be made without departing from the spirit and scope of the present invention. The present application is based on Japanese Patent Application No. 2020-11471 filed on Jan. 28, 2020, the contents of which are incorporated herein by reference.

INDUSTRIAL APPLICABILITY

The silica particles of the present invention and the silica sol of the present invention can be suitably used for polishing applications. The silica particles of the present invention and the silica sol of the present invention, for example, can be used for polishing of a semiconductor material such as a silicon wafer, polishing of an electronic material such as a hard disk substrate, polishing (chemical mechanical polishing) in a planarization step in manufacturing an integrated circuit, polishing of a synthetic quartz glass substrate used for a photomask or liquid crystal, polishing of a magnetic disk substrate, and the like, and among them, can be particularly suitably used for polishing or chemical mechanical polishing of a silicon wafer.

The invention claimed is:

1. A silica particle in which an average value of a circularity coefficient measured by a field-emission scanning electron microscope is 0.90 or more, wherein the silica particle has an average value of a Heywood diameter measured by a field-emission scanning electron microscope is 30 nm or less, and any of the following features (A) and (C):

(A) a standard deviation of the circularity coefficient is 0.05 or less, and (C) an average value of an aspect ratio measured by a field-emission scanning electron microscope is 1.20 or less.

2. The silica particle according to claim 1, wherein the average value of a Heywood diameter measured by a field-emission scanning electron microscope is 20 nm or less.

3. The silica particle according to claim 2, wherein an average value of an aspect ratio measured by a field-emission scanning electron microscope is 1.20 or less.

4. The silica particle according to claim 3, wherein a standard deviation of the aspect ratio is 0.15 or less.

5. The silica particle according to claim 2, wherein a standard deviation of the Heywood diameter is 3.00 nm or less.

6. The silica particle according to claim 1, wherein the silica particle has the feature (A), and an average value of an aspect ratio measured by a field-emission scanning electron microscope is 1.20 or less.

7. The silica particle according to claim 6, wherein a standard deviation of the aspect ratio is 0.15 or less.

8. The silica particle according to claim 1, wherein a standard deviation of the Heywood diameter is 3.00 nm or less.

9. The silica particle according to claim 1, wherein a content of metal impurity is 5 ppm or less.

10. The silica particle according to claim 9, wherein the content of metal impurity is a total content of sodium, potassium, iron, aluminum, calcium, magnesium, zinc, cobalt, chromium, copper, manganese, lead, titanium, silver, and nickel present in the silica particle.

11. The silica particle according to claim 1 comprising: a tetraalkoxysilane condensate as a main component.

12. A silica sol comprising: the silica particle according to claim 1.

13. A polishing composition comprising: the silica sol according to claim 12.

14. A polishing method, comprising: polishing a substrate using the polishing composition according to claim 13.

15. A method for producing a semiconductor wafer, comprising: polishing the semiconductor wafer using the polishing composition according to claim 13.

16. A method for producing a semiconductor device, comprising: polishing the semiconductor device using the polishing composition according to claim 13.

* * * * *